US006845025B1

(12) United States Patent
Nataraj

(10) Patent No.: US 6,845,025 B1
(45) Date of Patent: Jan. 18, 2005

(54) WORD LINE DRIVER CIRCUIT FOR A CONTENT ADDRESSABLE MEMORY

(75) Inventor: Bindiganavale S. Nataraj, Cupertino, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 10/394,466

(22) Filed: Mar. 21, 2003

(51) Int. Cl.[7] ............................ G11C 15/00; G11C 7/00; G11C 8/00; H02M 11/00; G06F 12/00
(52) U.S. Cl. ............... 365/49; 365/189.07; 365/189.08; 365/189.09; 365/189.11; 365/230.06; 327/103; 711/108
(58) Field of Search ..................... 365/49, 230.06, 365/189.07; 327/90, 103; 711/108

(56) References Cited

U.S. PATENT DOCUMENTS

| 5,226,005 | A | | 7/1993 | Lee ............................ 365/49 |
| 5,233,559 | A | * | 8/1993 | Brennan, Jr. ........... 365/185.09 |
| 5,289,403 | A | * | 2/1994 | Yetter ........................... 365/49 |
| 5,341,500 | A | * | 8/1994 | Moyer et al. ................ 710/200 |
| 5,371,697 | A | * | 12/1994 | Yamada ........................ 365/49 |
| 5,422,838 | A | * | 6/1995 | Lin ............................... 365/49 |
| 5,905,680 | A | * | 5/1999 | Bosshart ................ 365/189.07 |
| 6,078,987 | A | * | 6/2000 | Kongetira .................... 711/108 |
| 6,122,710 | A | * | 9/2000 | Kumar et al. ................ 711/118 |
| 6,208,543 | B1 | * | 3/2001 | Tupuri et al. .................. 365/49 |
| 6,362,993 | B1 | | 3/2002 | Henderson .................... 365/49 |
| 6,396,749 | B2 | | 5/2002 | Al-Shamma ................ 365/200 |
| 6,411,538 | B1 | | 6/2002 | Kengeri ........................ 365/49 |
| 6,564,344 | B1 | * | 5/2003 | Bui et al. .................... 714/718 |
| 6,721,202 | B1 | * | 4/2004 | Roge et al. ................. 365/168 |

* cited by examiner

*Primary Examiner*—David Nelms
*Assistant Examiner*—Ly Duy Pham
(74) *Attorney, Agent, or Firm*—William L Paradice, III

(57) ABSTRACT

A word line driver circuit is coupled to a word line of an associated Content Addressable Memory (CAM) array. The word line driver circuit adjusts the word line read voltage in response to a compare signal indicative of whether the CAM array is performing a concurrent compare operation. For some embodiments, the word line driver circuit selectively provides a relatively high word line read voltage or a relatively low word line read voltage in response to the compare signal.

26 Claims, 10 Drawing Sheets

WORD LINE DRIVER CIRCUIT FOR A CONTENT ADDRESSABLE MEMORY

FIELD OF INVENTION

This invention relates generally to content addressable memories and specifically to improving the reliability of match results for content addressable memories.

BACKGROUND

A content addressable memory (CAM) device is a storage device having an array of memory cells that can be instructed to compare the specific pattern of a comparand word with data words stored in corresponding rows of the array. During a compare operation, the comparand word is provided to the CAM array and compared with all the CAM words. For each CAM word that matches the comparand word, a corresponding match line is asserted to indicate the match result. If any of the match lines are asserted, a match flag is typically asserted to indicate the match condition, and the match address or index of the highest priority matching entry in the CAM array is determined.

FIG. 1 shows a conventional binary CAM cell 100 including a memory cell 110 for storing a data bit D and a compare circuit 120 for comparing the data bit with a comparand bit C. Memory cell 110 includes a latch formed by cross-coupled inverters 112 and 114 that stores the data bit D at data node BLI and its complement at data node $\overline{BLI}$. Pass transistor 116 is coupled between node BLI and bit line BL, and has a gate coupled to a word line WL. Pass transistor 118 is coupled between node $\overline{BLI}$ and complementary bit line $\overline{BL}$, and has a gate coupled to word line WL. Compare circuit 120 includes NMOS transistors 122, 124, 126, and 128. Transistors 122 and 124 are coupled in series between match line ML and ground potential, with the gate of transistor 122 receiving the data bit D from node BLI, and the gate of transistor 124 receiving the complement $\overline{C}$ of the comparand bit from complementary comparand line $\overline{CL}$. Transistors 126 and 128 are coupled in series between match line ML and ground potential, with the gate of transistor 126 receiving the complement $\overline{D}$ of the data bit from node $\overline{BLI}$, and the gate of transistor 128 receiving the comparand bit C from the comparand line CL. Having separate bit and comparand line pairs allows an array of CAM cells 100 to perform read and compare operations at the same time, which in turn may provide a performance advantage.

A weak PMOS pull-up transistor 10 is coupled between bit line BL and a supply voltage $V_{DD}$, and has a gate coupled to ground potential to maintain transistor 10 in a conductive state. Similarly, a weak PMOS pull-up transistor 12 is coupled between complementary bit line $\overline{BL}$ and $V_{DD}$, and has a gate coupled to ground potential to maintain transistor 12 in a conductive state. Together, pull-up transistors 10 and 12 pre-charge the bit line pair BL and $\overline{BL}$ toward $V_{DD}$ before and after read and write operations (e.g., when WL is de-asserted to logic low).

However, pull-up transistor 10 also pulls BL to a voltage between $V_{DD}$ and ground potential when BLI is a logic zero and WL is asserted to logic high (e.g., during read and write operations). Similarly, pull-up transistor 12 also pulls $\overline{BL}$ to a voltage between $V_{DD}$ and ground potential when $\overline{BLI}$ is a logic zero and WL is asserted to logic high. As a result, when simultaneously performing read and compare operations on CAM cell 100, bit line charge currents provided by pull-up transistors 10 and 12 may result in erroneous mismatch conditions indicated on the match line ML.

For example, during a compare operation between a logic low data bit D and a logic low comparand bit C (i.e., a match condition), CAM cell 100's internal data nodes BLI and $\overline{BLI}$ are at approximately ground potential (D=0) and $V_{DD}$ ($\overline{D}$=1), respectively, and the match line ML is pre-charged to $V_{DD}$ by a well-known pre-charge circuit (not shown for simplicity). Comparand lines CL and $\overline{CL}$ are driven to approximately ground potential (C=0) and $V_{DD}$ ($\overline{C}$=1), respectively. The logic high signals at node $\overline{BLI}$ and on line $\overline{CL}$ turn on transistors 126 and 124, respectively, and the logic low signals at node BLI and on line CL turn off transistors 122 and 128, respectively. Thus, because transistors 122 and 128 are non-conductive, compare circuit 120 does not discharge match line ML, which remains in its charged state to indicate the match condition.

If there is a concurrent read operation for CAM cell 100, the word line WL is driven to logic high to turn on pass transistors 116 and 118, which in turn couple the gate of transistor 122 to bit line BL and the gate of transistor 126 to complementary bit line $\overline{BL}$, respectively. Because pull-up transistor 10 remains conductive, data node BLI is undesirably charged towards $V_{DD}$ via pass transistor 116 and pull-up transistor 10 during the compare operation. As the voltage on node BLI approaches the threshold voltage VT of transistor 122, transistor 122 conducts a leakage current that begins discharging match line ML through transistor 124 towards ground potential. Thus, for a CAM array having many CAM cells 100 per row, the cumulative leakage current in compare circuits 120 of all CAM cells 100 in a selected row may sufficiently discharge the match line ML to erroneously indicate a mismatch condition for the row.

As semiconductor fabrication technologies become smaller, supply voltages and transistor threshold voltages become smaller, which in turn may exacerbate these undesirable leakage currents during concurrent read and compare operations. Further, when word line WL is selected for read and write operations, the conductive pull-up transistors 10 and 12 form current paths to ground potential through pass transistors 116 and 118 and the pull-down transistors (not shown) in inverters 112 and 114. These current paths to ground potential may result in undesirable power dissipation.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

A method and apparatus for controlling the word line read voltages of a CAM array are described below in the context of a CAM device 200 for simplicity only. It is to be understood that embodiments of the present invention may be used in any suitable CAM array or device including, for example, binary, ternary, or quaternary CAM arrays having either NOR or NAND type compare circuits. Further, the logic levels assigned to various signals in the description below are arbitrary and, thus, may be modified (e.g., reversed polarity) as desired. Additionally, the interconnection between circuit elements or blocks may be shown as buses or as single signal lines. Each of the buses may alternatively be a single signal line, and each of the single signal lines may alternatively be a bus. Accordingly, the present invention is not to be construed as limited to specific examples described herein but rather includes within its scope all embodiments defined by the appended claims.

Embodiments of the present invention improve the reliability of match results for a CAM array by providing a relatively low word line read voltage during concurrent read and compare operations. The relatively low word line read voltage minimizes inadvertent voltage swings on data nodes within CAM cells selected for reading, which in turn minimizes the undesirable leakage currents which may result in erroneous indications of the mismatch condition. When there is not a concurrent compare operation, a relatively high word line read voltage is provided to selected rows to maximize speed of the read operation.

Figure 2:
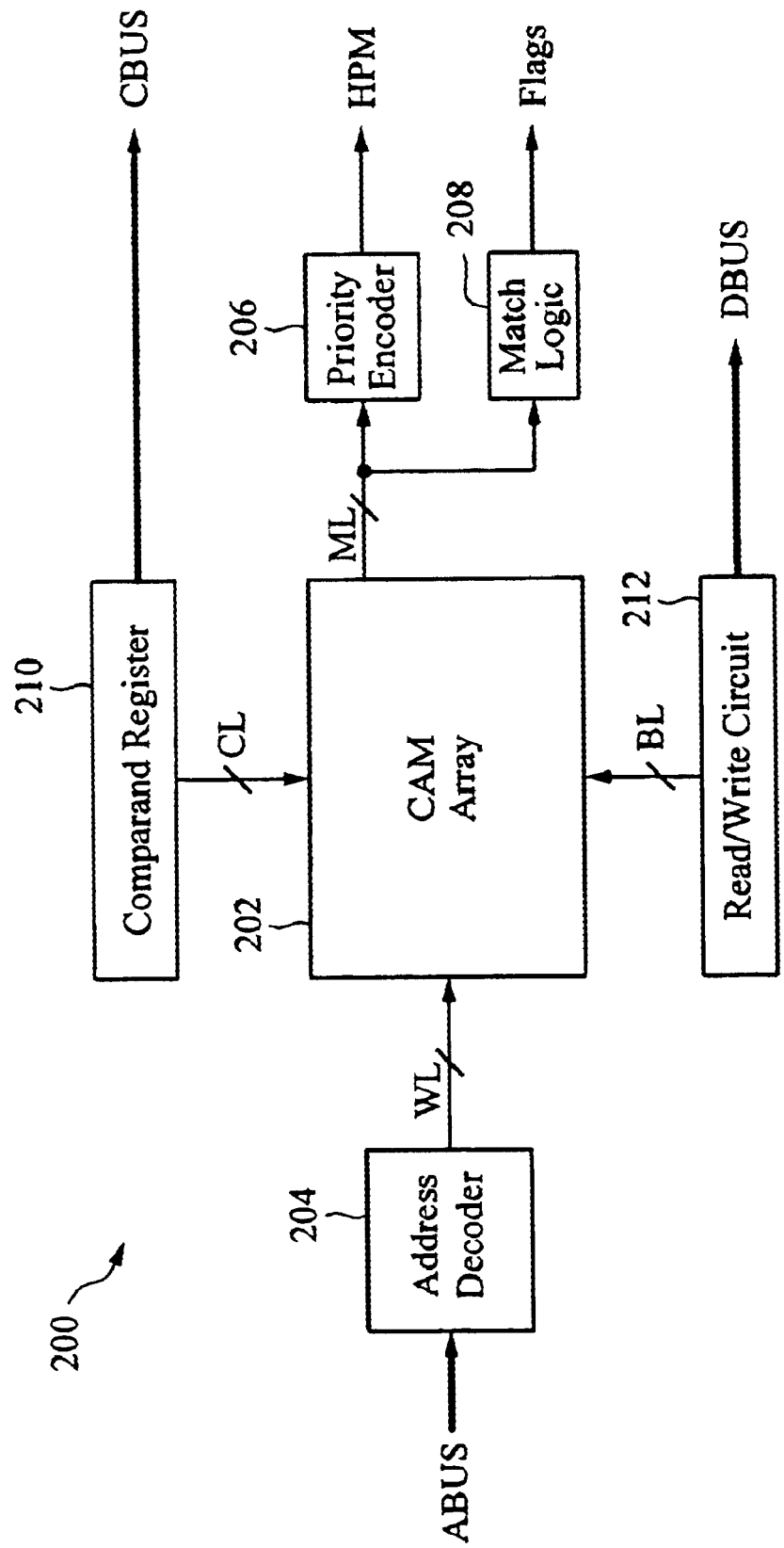
FIG. 2 is a block diagram of a CAM device within which embodiments of the present invention may be implemented.

FIG. 2 shows an exemplary CAM device 200 within which embodiments of the present invention may be implemented. CAM device 200 includes a CAM array 202 that has a plurality of CAM cells (not shown in FIG. 2 for simplicity) arranged in any number of rows and columns. The CAM cells in array 202 may be any suitable type of CAM cell. One or more instructions and related control signals may be provided to CAM device 200 from an instruction decoder (not shown for simplicity) to control read, write, and compare operations for CAM device 200. Other well-known signals which may be provided to CAM device 200, such as enable signals, reset signals, and clock signals, are not shown for simplicity.

Each row of CAM cells in array 202 is coupled to an address decoder 204 via a corresponding word line WL, and to a priority encoder 206 and to match logic 208 via a corresponding match line ML. The word lines and match lines are represented collectively in FIG. 2 for simplicity. For one embodiment, address decoder 204 receives addresses from an address bus ABUS. For other embodiments, address decoder 204 receives addresses from another bus. The match lines ML provide match results for compare operations to priority encoder 206, which determines the matching entry that has the highest priority number associated with it and generates the index or address of this highest priority match (HPM). Match logic 208 may generate a match flag to indicate a match condition, and may also generate a multiple match flag to indicate multiple matches.

Further, although not shown in FIG. 2 for simplicity, each row of CAM cells in array 202 may have one or more validity bits to indicate whether the corresponding row (or segment thereof) of CAM cells is in a valid state or an empty state. The validity bits may be provided to priority encoder 206 to generate the next free address (NFA) that is available in CAM array 202 for storing new data. The validity bits may also be provided to a well-known full flag logic circuit (not shown for simplicity) to generate a full flag and/or empty flag for CAM array 202.

Each column of CAM cells in array 202 is coupled to a comparand register 210 via comparand lines CL and to a read/write circuit 212 via bit lines BL. Comparand register 210 provides a comparand word (e.g., search key) received from a comparand bus CBUS to CAM array 202 for comparison with entries stored in CAM array 202. For other embodiments, comparand words may be provided to comparand register 210 from another bus. Read/write circuit 212 includes well-known write drivers and sense amplifiers, and is coupled to a data bus DBUS. Although not shown for simplicity, CAM device 200 may also include a global mask circuit that stores one or more mask patterns that mask entries in CAM array 202 during compare operations with the comparand word provided by comparand register 210.

Figure 3A:
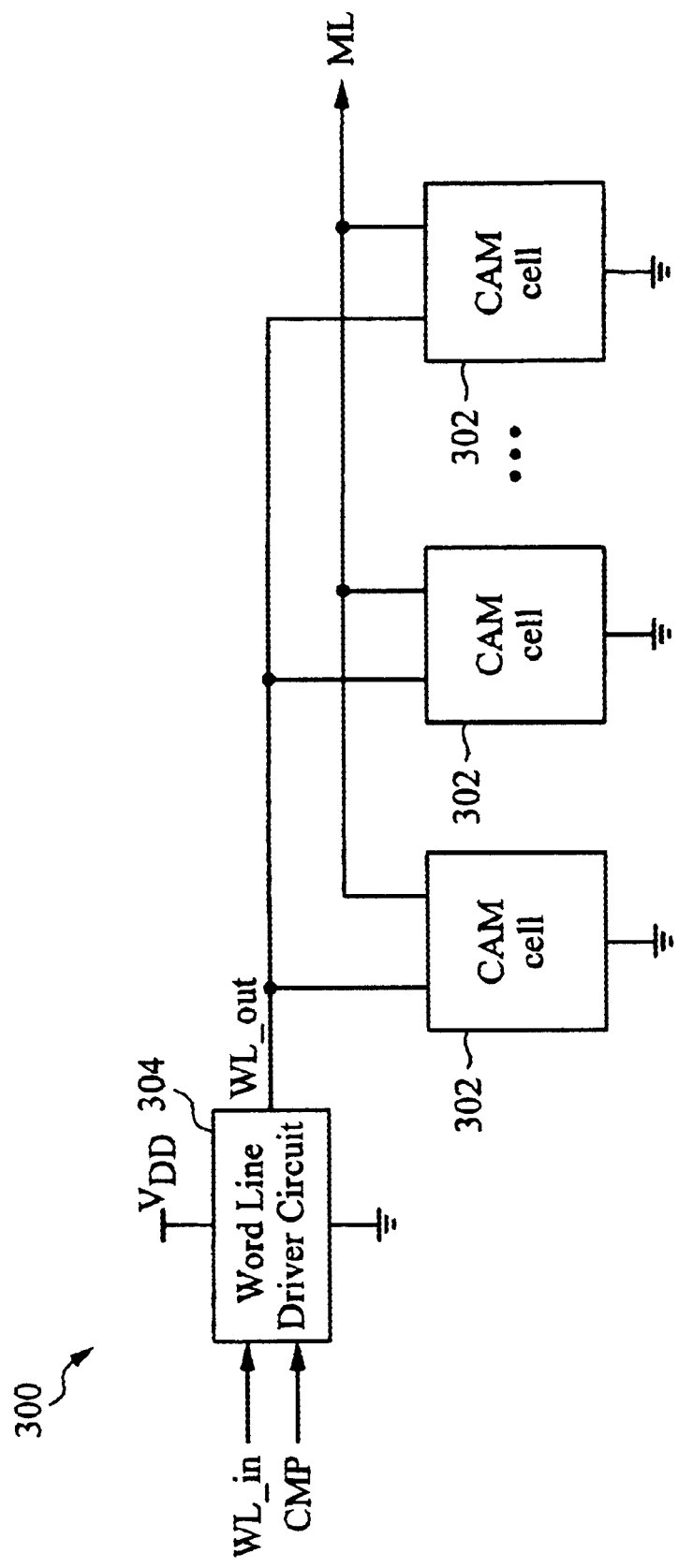
FIG. 3A is a block diagram of a row of the CAM array of FIG. 2 including a word line driver circuit in accordance with one embodiment of the present invention.

FIG. 3A shows a row 300 for one embodiment of the CAM array 202 of FIG. 2. Row 300 includes a plurality of CAM cells 302, each coupled between a match line ML and ground potential, and a word line driver circuit 304 in accordance with the present invention. CAM cells 302, which include at least one storage element and at least one compare circuit to compare comparand data with data stored in the storage element, are well-known, and may be any suitable binary, ternary, or quaternary cell implemented using volatile memory including, for example, Static Random Access Memory (SRAM) or Dynamic RAM (DRAM). For other embodiments, CAM cells 302 may be implemented using non-volatile memory.

Figure 1:
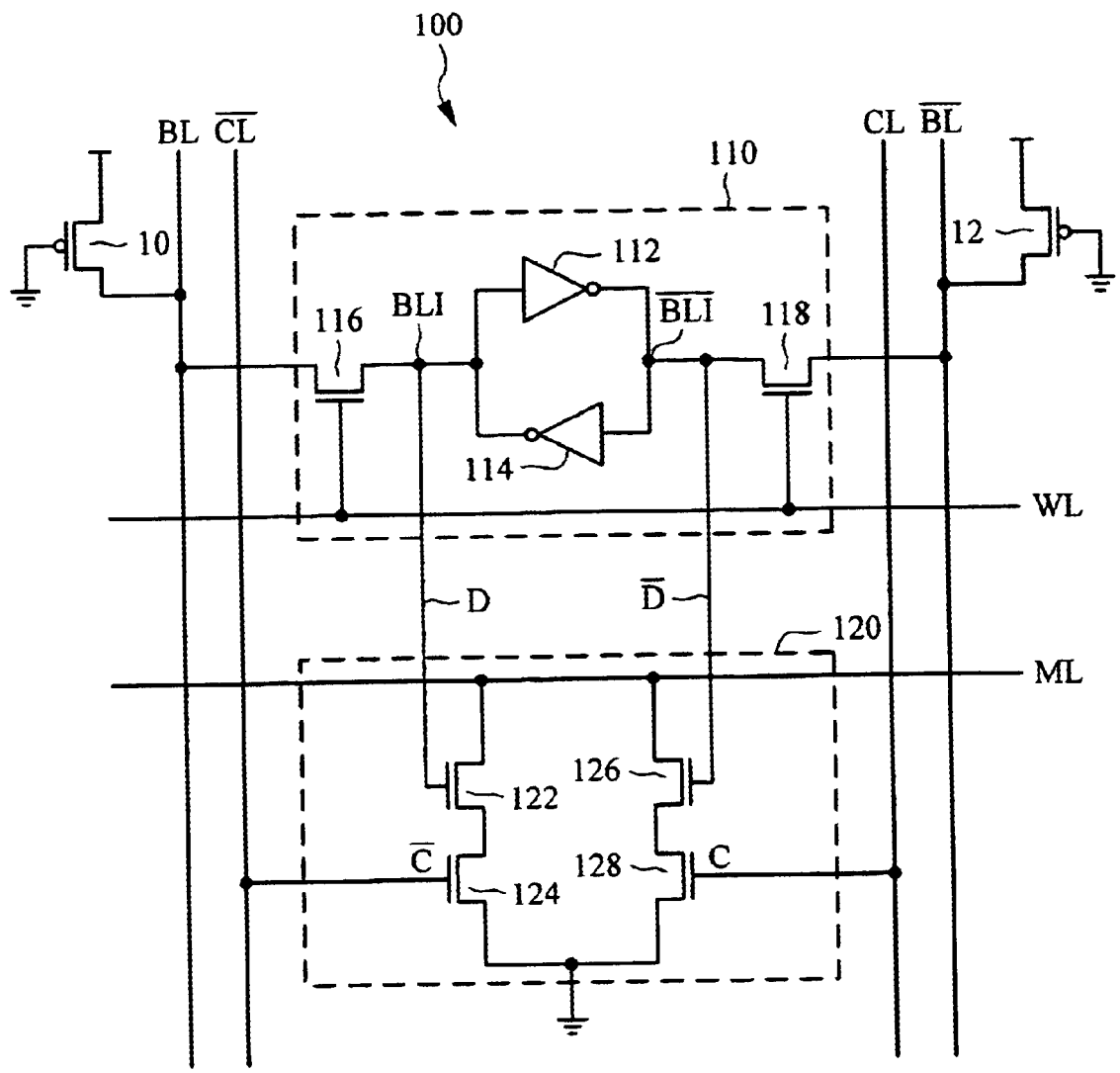
FIG. 1 is a circuit diagram of a conventional binary CAM cell having separate bit lines and comparand lines.
Figure 3B:
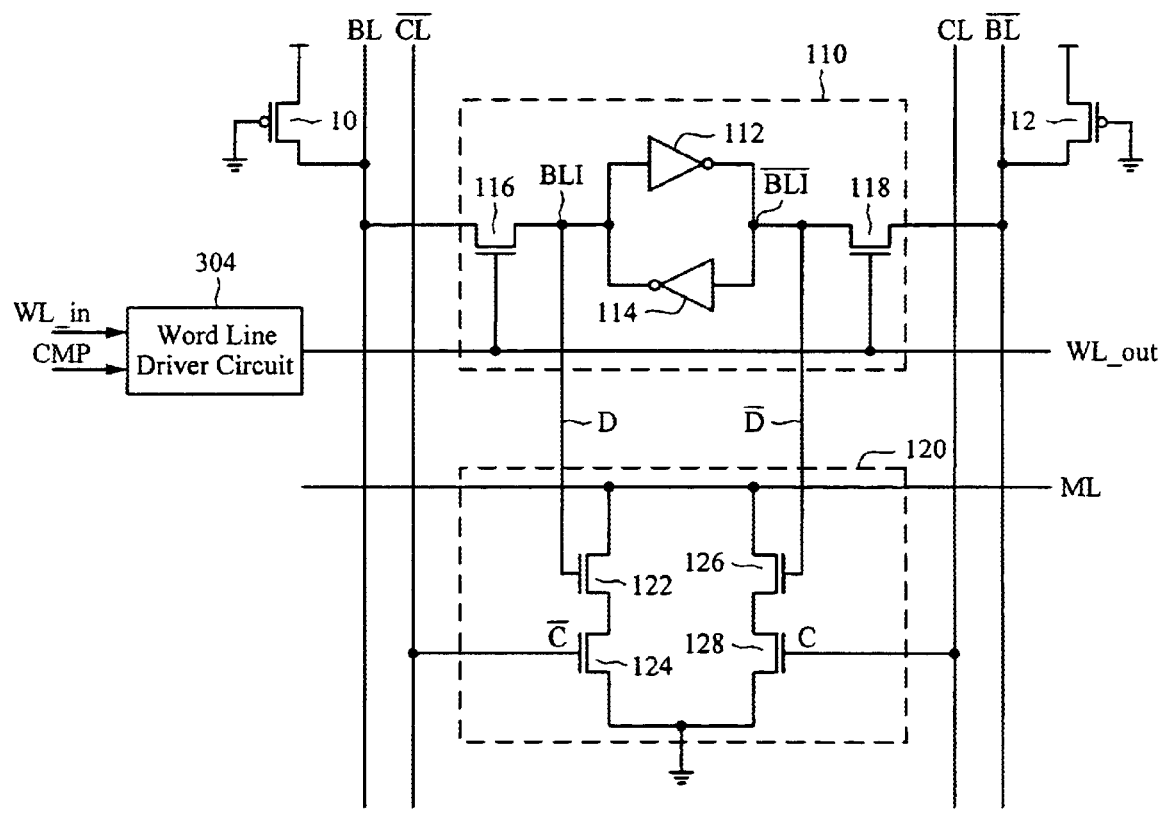
FIG. 3B is a circuit diagram of one embodiment of the CAM cells of FIG. 3A.
Figure 4:
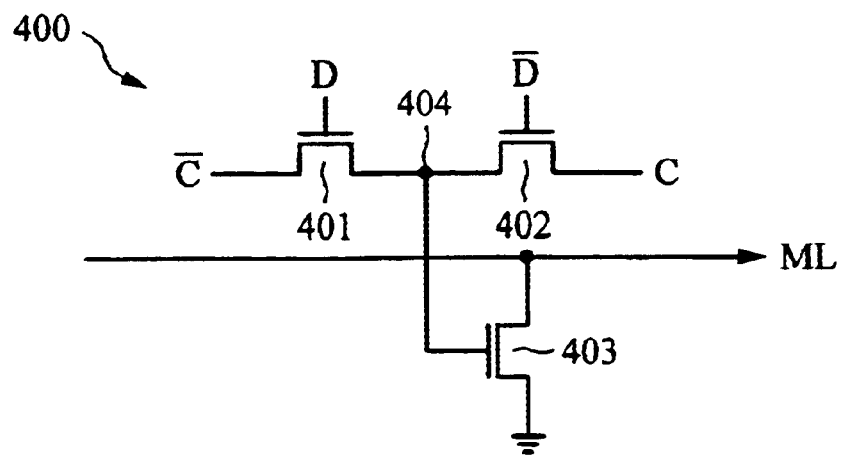
FIG. 4 is a circuit diagram of another embodiment of a compare circuit for the CAM cells of FIG. 3B.

FIG. 3B shows one embodiment of CAM cell 302 that includes the memory cell 110 and compare circuit 120 of CAM cell 100 of FIG. 1, where inverters 112 and 114 may be any suitable inverters such as, for example, CMOS inverters. CAM cell 302 operates in a manner similar to that of CAM cell 100, as described above with respect to FIG. 1. For other embodiments, other suitable storage elements may be used for memory cell 110, and other suitable compare circuits may be used for compare circuit 120. For other embodiments, the well-known compare circuit 400 of FIG. 4 may be used for compare circuit 120.

Referring again to FIG. 3A, word line driver circuit 304 is coupled between first and second portions of a word line WL_in and WL_out, respectively, and includes a control terminal to receive a compare signal CMP indicative of a compare operation. Word line driver circuit 304 also includes power terminals coupled to a supply voltage $V_{DD}$ and ground potential. WL_in is coupled to address decoder 204 (see also FIG. 2), and CAM cells 302 are coupled to WL_out. For simplicity, various other well-known clock, enable, and control signals are not shown in FIG. 3. As explained in detail below, when WL_in is asserted by address decoder 204 to select row 300 for a read operation, word line driver circuit 304 adjusts the read voltage for WL_out in response to CMP to provide a relatively low word line voltage if CAM device 200 is also performing a compare operation and to provide a relatively high word line read voltage if CAM device 200 is not performing a concurrent compare operation. For one embodiment, CMP is asserted (e.g., to logic high) when CAM device 200 is performing a compare operation, and CMP is de-asserted (e.g., to logic low) when CAM device 200 is not performing a compare operation.

Figure 5:
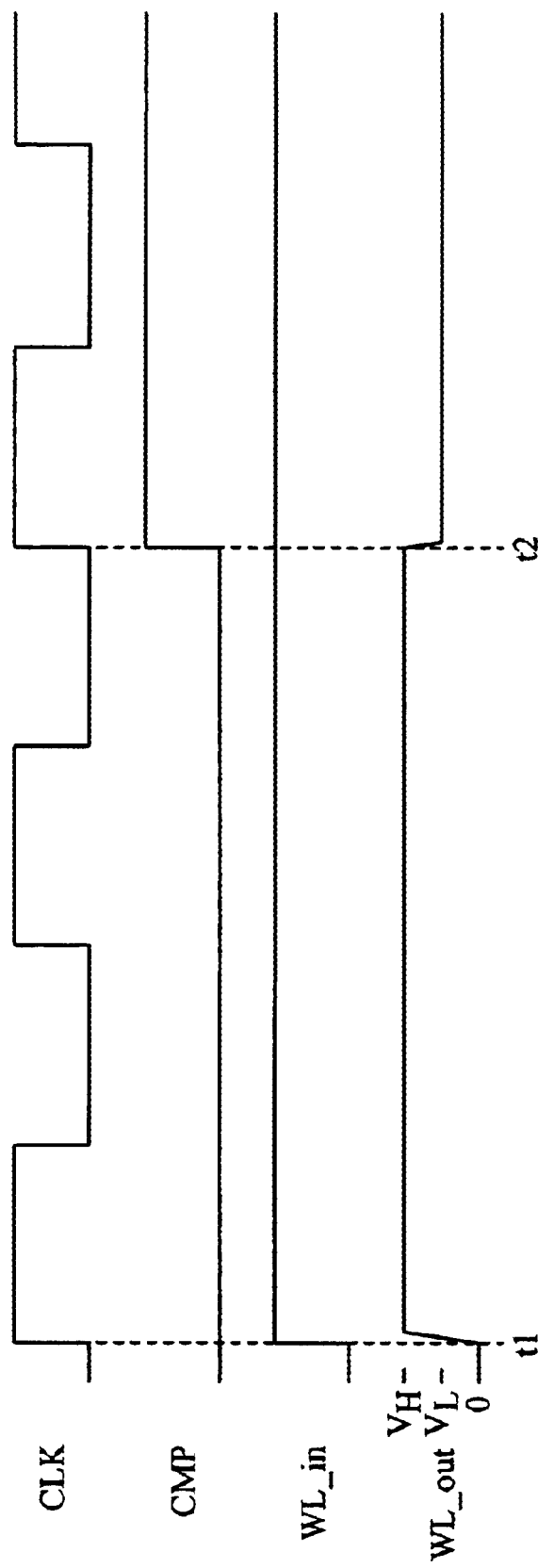
FIG. 5 is a qualitative timing diagram illustrating the operation of one embodiment of the word line driver circuit of FIG. 3A.

An exemplary operation of word line driver circuit 304 is discussed below with respect to the qualitative timing diagram of FIG. 5. Initially, CMP is de-asserted to a logic low state to indicate that CAM device 200 is not performing a compare operation. At time t1, address decoder 204 asserts WL_in to logic high to select row 300 for a read operation. Address decoder 204 may assert WL_in in response to an address on ABUS, the next free address (NFA) provided by priority encoder 206, or other suitable address. In response to WL_in and the de-asserted state of CMP, word line driver circuit 304 drives WL_out with a relatively high read voltage $V_H$. For one embodiment, $V_H$ is equal to the supply voltage, e.g., $V_H=V_{DD}$. Referring also to FIG. 3B, the high read voltage $V_H$ on WL_out facilitates relatively low impedance paths through pass transistors 116 and 118, which in turn allow node BLI to quickly drive D onto BL and allow node $\overline{BLI}$ to quickly drive $\overline{D}$ onto $\overline{BL}$, respectively. Sense amplifiers within read/write circuit 212 detect the voltage levels on BL and $\overline{BL}$, and output the resultant data onto DBUS in a well-known manner.

At time t2, a concurrent compare operation is commenced, and CMP is asserted to logic high. CAM cells 302 become responsive to bit comparisons between the comparand bit and data stored in CAM cells 302, and thereafter generate match results on match lines ML. In response to WL_in and the asserted state of CMP, word line driver circuit 304 drives WL_out with a relatively low read voltage $V_L$. For one embodiment, $V_L$ is equal to one transistor threshold voltage below the supply voltage, e.g., $V_L=V_{DD}-V_T$. For other embodiments, $V_L$ may be more than or less than one $V_T$ below $V_{DD}$.

The relatively low read voltage $V_L$ on WL_out facilitates relatively high impedance paths through pass transistors 116 and 118. The relatively high impedance path through transistor 116 reduces the undesirable charging of data node BLI (i.e., when BLI is logic zero) through pass transistor 116 and pull-up transistor 10, thereby also reducing the gate voltage of compare transistor 122 to minimize leakage currents therein. Similarly, the relatively high impedance path through transistor 118 reduces the undesirable charging of data node $\overline{BLI}$ (e.g., when $\overline{BLI}$ is logic zero) through pass transistor 118 and pull-up transistor 12, thereby also reducing the gate voltage of compare transistor 126 to reduce leakage currents therein. Thus, by minimizing undesirable leakage currents in compare transistors 122 and 126 that could result in erroneous indications of the mismatch condition, word line driver circuit 304 improves the reliability of match results for CAM device 200.

Figure 3C:
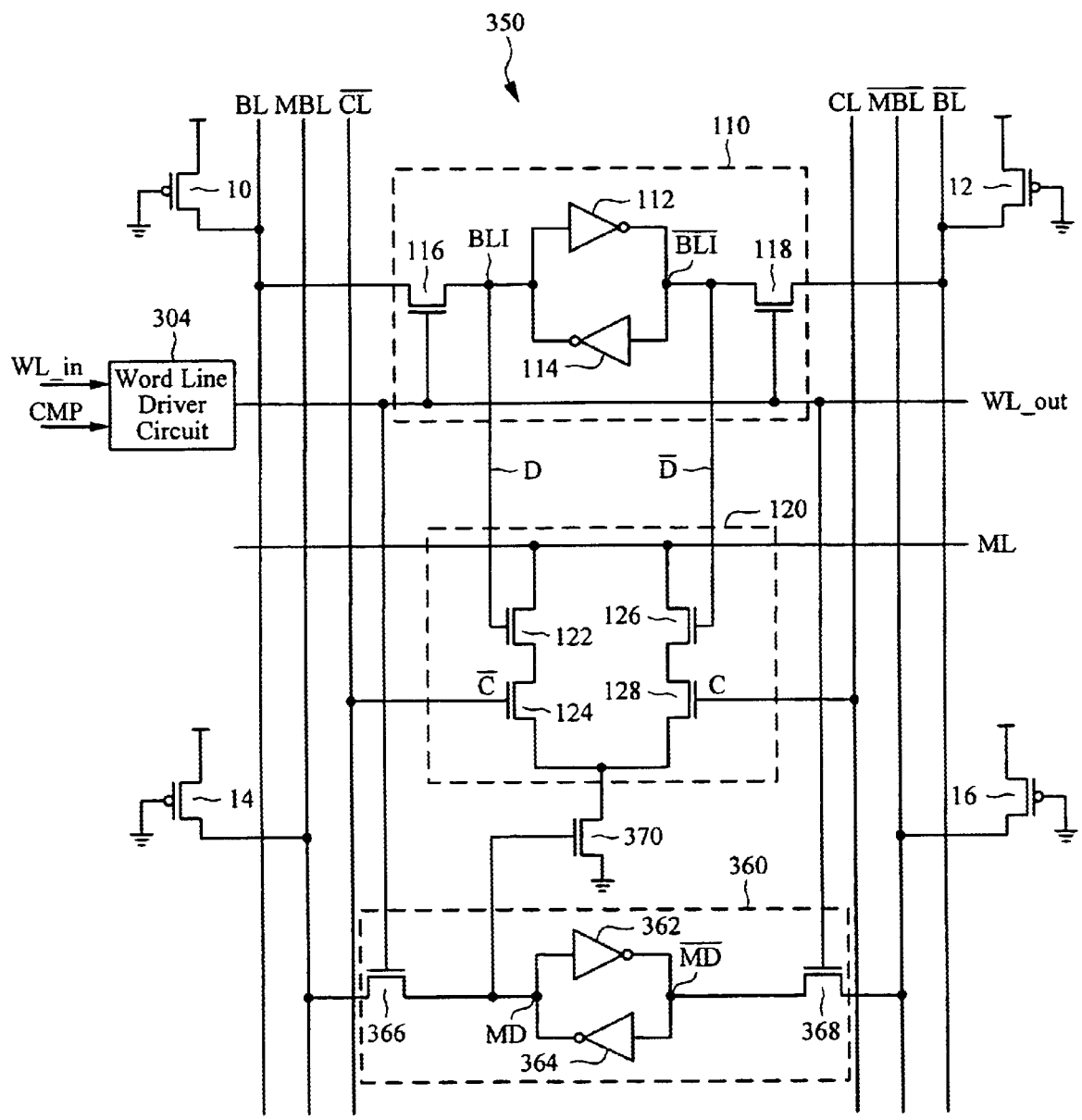
FIG. 3C is a circuit diagram of another embodiment of the CAM cells of FIG. 3A.

As mentioned above, for other embodiments, CAM cells 302 may be ternary CAM cells. For example, FIG. 3C shows ternary CAM cell 350 that is another embodiment of CAM cell 302. Ternary CAM (TCAM) cell 350 includes the memory cell 110 and compare circuit 120 described above with respect to FIG. 3B, and also includes a mask memory cell 360 and a mask circuit 370. Mask memory cell 360 includes a latch formed by cross-coupled inverters 362 and 364 that stores a mask data bit at node MD and its complement at node $\overline{MD}$. Pass transistor 366 is coupled between node MD and a mask bit line BL, and has a gate coupled to word line WL_out. Pass transistor 368 is coupled between node $\overline{MD}$ and a complementary mask bit line $\overline{MBL}$, and has a gate coupled to word line WL_out. Mask circuit 370 is an NMOS transistor connected between compare circuit 120 and ground potential and having a gate to receive the mask bit from node MD.

A weak PMOS pull-up transistor 14 is coupled between mask bit line MBL and supply voltage $V_{DD}$, and has a gate coupled to ground potential to maintain transistor 14 in a conductive state. Similarly, a weak PMOS pull-up transistor 16 is coupled between complementary mask bit line $\overline{MBL}$ and $V_{DD}$, and has a gate coupled to ground potential to maintain transistor 16 in a conductive state. Together, pull-up transistors 14 and 16 pre-charge the mask bit line pair BL and $\overline{BL}$ toward $V_{DD}$ before and after read and write operations (e.g., when WL_out is de-asserted to logic low).

During concurrent read and compare operations, word line driver circuit 304 drives WL_out with the relatively low read voltage $V_L$ to facilitate relatively high impedance paths through pass transistors 116 and 118 which, as described above with respect to FIG. 3B, minimizes undesirable leakage currents in compare transistors 122 and 126 that could result in erroneous indications of the mismatch condition. In addition, for embodiment of FIG. 3C, the relatively low read voltage $V_L$ on WL_out facilitates relatively high impedance paths through pass transistors 366 and 368. The relatively high impedance path through pass transistor 366 minimizes the undesirable charging of mask node MD (i.e., when MD=0) through pass transistor 366 and pull-up transistor 14 via MBL, thereby also minimizing the gate voltage of mask transistor 370 to minimize in leakage currents therein that could inadvertently discharge the match line ML.

Conversely, when there is not a concurrent compare operation, word line driver circuit 304 drives WL_out with the relatively high read voltage $V_H$, which in turn causes pass transistor 366 to provide a relatively low impedance path between MBL and MD to maximize performance.

Figure 3D:
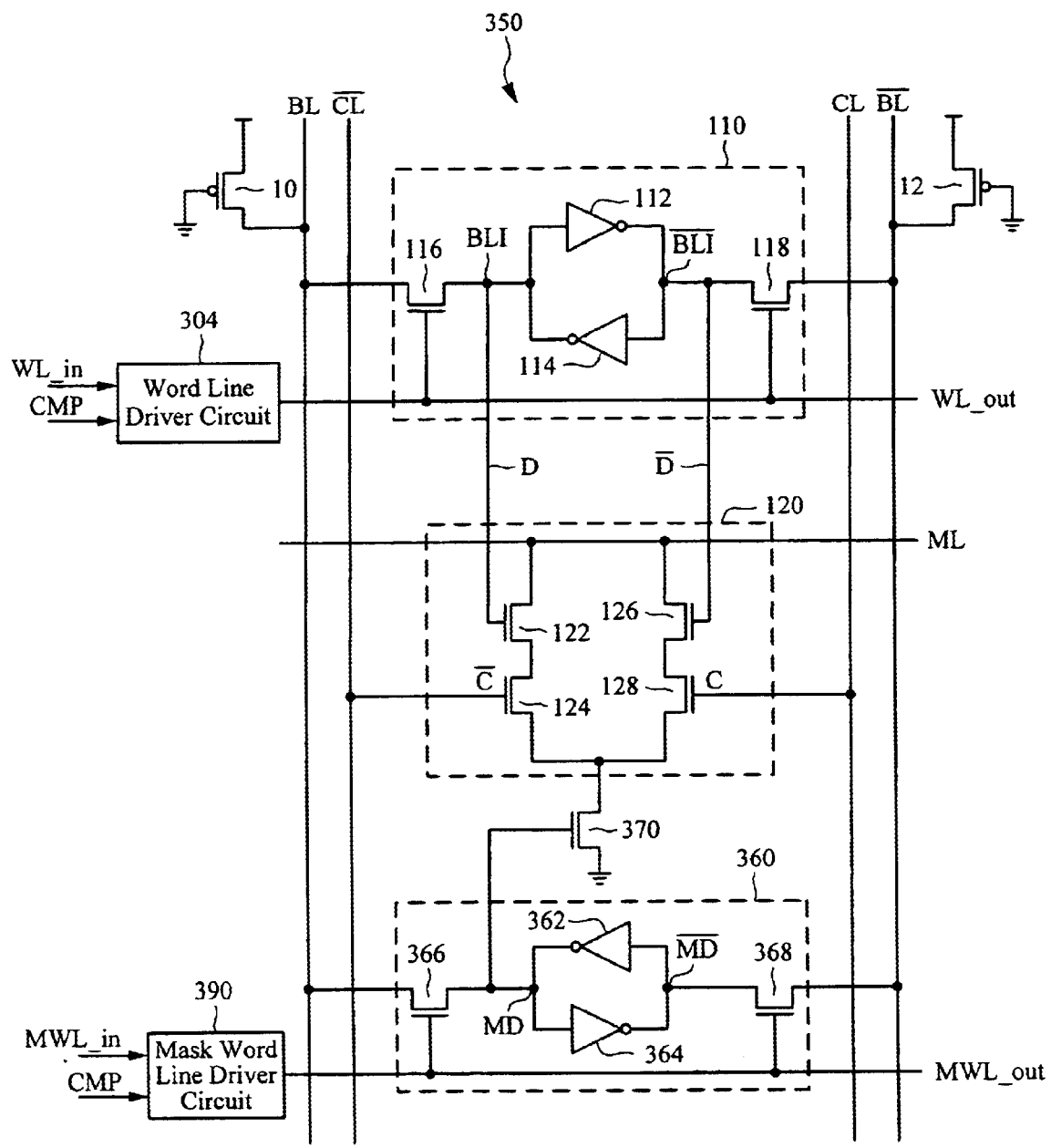
FIG. 3D is a circuit diagram of yet another embodiment of the CAM cells of FIG. 3A.

For other embodiments, the TCAM cell 350 may be provided within a CAM array having one bit line pair per column and separate data and mask word lines, as shown in FIG. 3D. For the embodiment of FIG. 3D, pass transistor 366 is coupled between MD and BL, and has a gate coupled to a mask word line MWL_out, and pass transistor 368 is coupled between $\overline{MD}$ and $\overline{BL}$, and has a gate coupled to mask word line MWL_out. A mask word line driver circuit 390 is coupled between first and second portions of the mask word line WL_in and WL_out, respectively, and includes a control terminal to receive CMP. Although not shown for simplicity, mask word line driver circuit 390 also includes power terminals coupled to a supply voltage $V_{DD}$ and ground potential. For some embodiments, mask word line driver circuit 390 drives MWL_out with the relatively low read voltage $V_L$ if there are concurrent read and compare operations, and drives MWL_out with the relatively high read voltage $V_H$ if there is read operation but not a concurrent compare operation. For one embodiment, mask word line driver circuit 390 is the same as word line driver circuit 304.

Figure 3E:
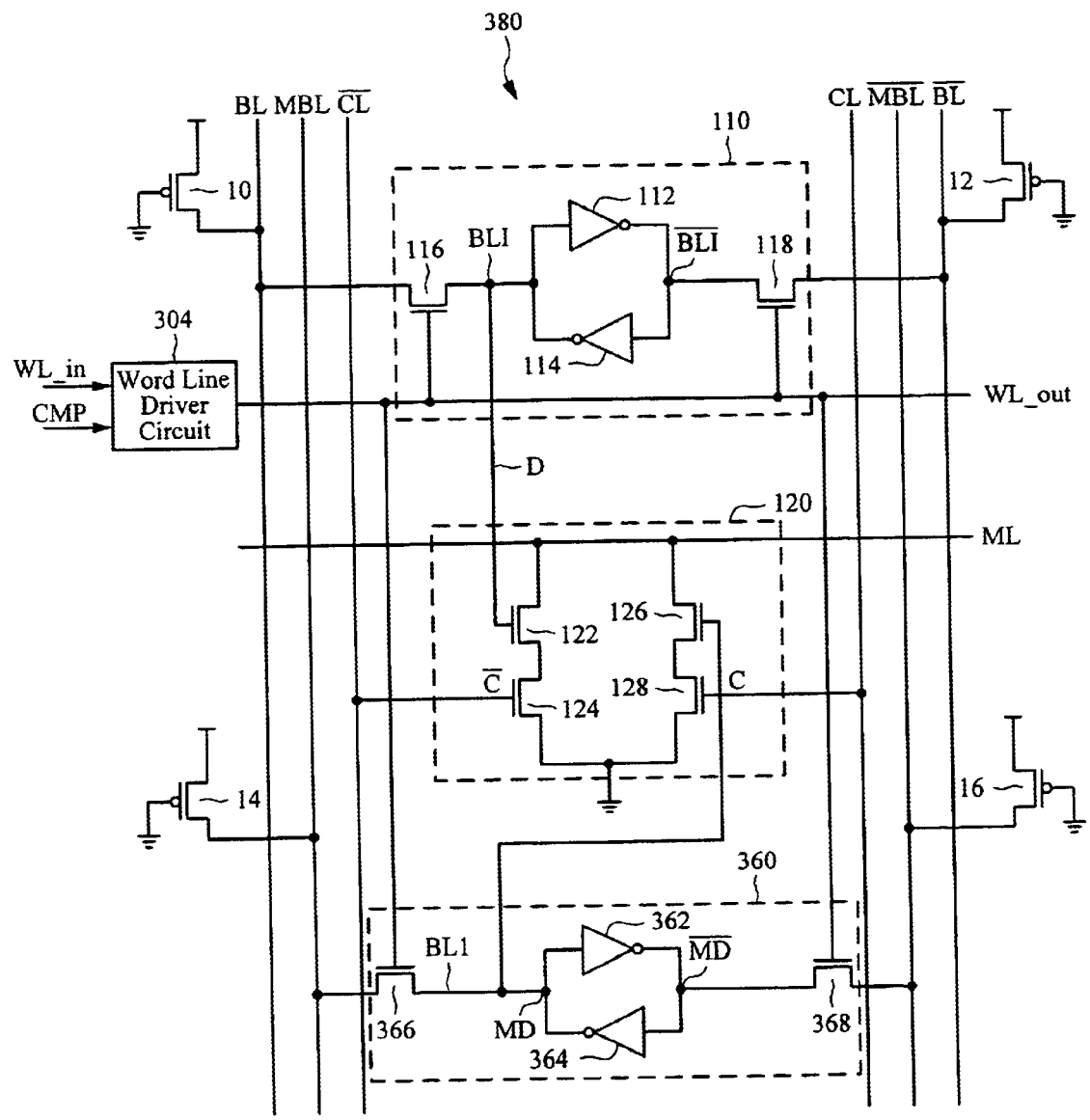
FIG. 3E is a circuit diagram of yet another embodiment of the CAM cells of FIG. 3A.

For another embodiment of CAM cell 350, the CAM cell may be configured as a quaternary CAM cell. One embodiment of a quaternary CAM cell is shown in FIG. 3E as CAM cell 380. In contrast to CAM cell 350 of FIG. 3C, MD is coupled to the gate of transistor 126 instead of $\overline{BLI}$, and transistor 370 is removed. CAM cell 380 is referred to as a quaternary CAM cell because it can store effectively four states of information: (i) a logic 0 when BLI and MD are logic 0 and logic 1, respectively, (ii) a logic 1 when BLI and MD are logic 1 and logic 0, respectively, (iii) a don't care state (i.e., always match) when BLI and MD are both logic 0, and (iv) and an always mismatch state when BLI and MD are both logic 1.

Referring again to FIG. 3A, word line driver circuit 304 may be implemented either as a separate circuit element or as part of another circuit. Thus, for some embodiments, word line driver circuits 304 are coupled between corresponding outputs of address decoder 204 and word lines of CAM array 202. For other embodiments, word line driver circuits 304 may be implemented within address decoder 204. For another embodiment, word line driver circuits 304 may be implemented within CAM array 202.

Figure 6:
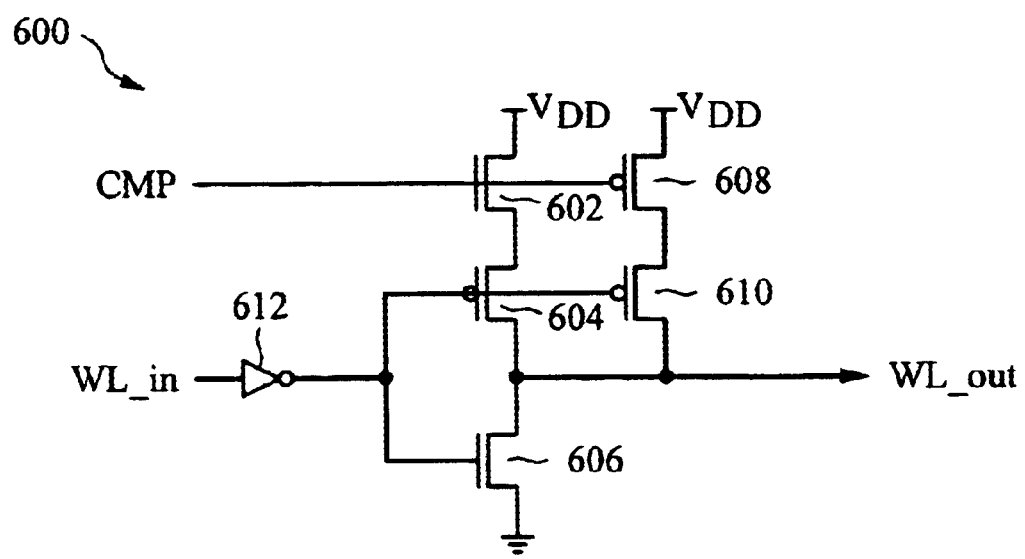
FIG. 6 is a circuit diagram of one embodiment of the word line driver circuit of FIG. 3A.

FIG. 6 shows a word line driver circuit 600 that is one embodiment of the word line driver circuit 304 of FIG. 3A. Word line driver circuit 600 includes NMOS transistors 602 and 604, PMOS transistors 606, 608, and 610, and a logical inverter 612. Transistors 602, 604, and 606 are coupled in series between $V_{DD}$ and ground potential, and transistors 608 and 610 are coupled in series between $V_{DD}$ and WL_out. Transistors 604 and 606 form an inverter having an input coupled to the output of inverter 612 and an output coupled to WL_out. Inverter 612, which may be any inverter circuit including, for example, a CMOS inverter, has an input coupled to WL_in. The output of inverter 612 is also coupled to transistor 610. CMP is provided to the gates of transistors 602 and 608.

When CMP is asserted to logic high to indicate a concurrent compare operation, transistor 602 turns on and transistor 608 turns off. If WL_in is asserted to logic high (e.g., to $V_{DD}$ by address decoder 204), inverter 612 drives the gates of transistors 604, 606, and 610 to logic low, which turns off transistor 606 and turns on transistors 604 and 610. Thus, transistors 602 and 604 charge WL_out toward $V_{DD}$. Because transistor 602 is an NMOS transistor, transistor 602's gate voltage must remain approximately one threshold voltage $V_T$ above its source voltage in order for transistor 602 to remain conductive. As a result, transistor 602 pulls WL_out to approximately $V_{DD}-V_T$, which for this embodiment is the low word line read voltage $V_L$.

Conversely, when CMP is de-asserted to logic low, transistor 602 turns off and transistor 608 turns on. If WL_in is asserted to logic high (e.g., to $V_{DD}$ by address decoder 204), inverter 612 drives the gates of transistors 604, 606, and 610 to logic low, which turns off transistor 606 and turns on transistors 604 and 610. Thus, transistors 608 and 610 charge WL_out toward $V_{DD}$. Because both transistors 608 and 610 are PMOS transistors, WL_out is driven to approximately $V_{DD}$, which for this embodiment is the high word line read voltage $V_H$.

Note that if WL_in is de-asserted to logic low, inverter 612 turns off transistors 604 and 610 and turns on transistor 606, which discharges WL_out to ground potential, irrespective of CMP.

Figure 7:
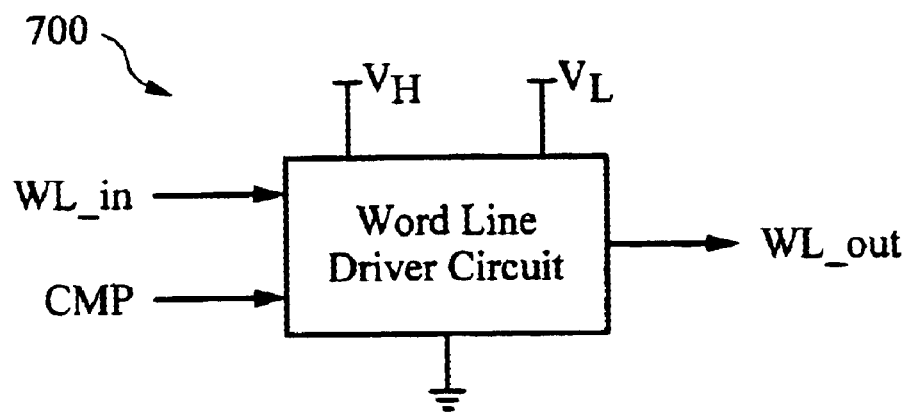
FIG. 7 is a block diagram of another embodiment of the word line driver circuit of FIG. 3A.

FIG. 7 shows a word line driver circuit 700 in accordance with another embodiment of the present invention. Word line driver circuit 700 is similar to word line driver circuit 304 of FIG. 3, except that word line driver circuit 700 includes power terminals coupled to a high voltage supply $V_H$, a low voltage supply $V_L$, and ground potential. When WL_in is asserted, word line driver circuit 700 couples WL_out to $V_L$ if there is a compare operation and couples WL_out to $V_H$ if there is not a compare operation. When WL_in is de-asserted, word line driver circuit 700 couples WL_out to ground potential.

Figure 8:
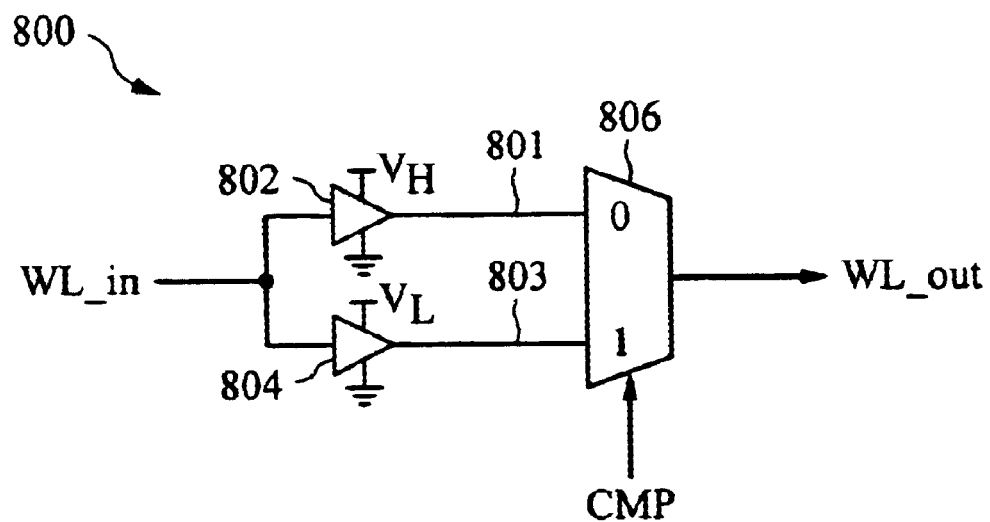
FIG. 8 is a circuit diagram of one embodiment of the word line driver circuit of FIG. 7.

FIG. 8 shows a word line driver circuit 800 that is one embodiment of word line driver circuit 700 of FIG. 7. Word line driver 800 has a high voltage driver 802, a low voltage driver 804, and a multiplexer 806. High voltage driver 802 includes power terminals coupled to $V_H$ and to ground potential, and includes an input coupled to WL_in and an output coupled to a first input of multiplexer 806. Low voltage driver 804 has power terminals coupled to $V_L$ and to ground potential, and includes an input coupled to WL_in and an output coupled to a second input of multiplexer 806. Multiplexer 806 also includes a control terminal to receive CMP and an output coupled to WL_out.

When WL_in is asserted to select a corresponding row for a read operation, high voltage driver 802 drives line 801 to $V_H$, and low voltage driver 804 drives line 803 to $V_L$. If CMP is asserted to indicate there is a concurrent compare operation, multiplexer 806 drives WL_out with the low voltage on line 803. Conversely, if CMP is de-asserted to indicate there is not a concurrent compare operation, multiplexer 806 drives WL_out with the high voltage on line 801. When WL_in is not asserted, drivers 802 and 804 drive respective lines 801 and 803 to ground potential and, in response thereto, multiplexer 806 drives WL_out to ground potential, irrespective of CMP.

For other embodiments, multiplexer 806 may be eliminated, and CMP may be used as enable signal for low voltage driver 804 and a complement of CMP (e.g., $\overline{CMP}$) may be used as an enable signal for high voltage driver 802.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A content addressable memory (CAM) array having any number of rows, each of the rows comprising:
   a plurality of CAM cells coupled to a word line; and
   a word line driver circuit having a first input to receive a decoded address signal, a second input to receive a compare signal, and an output coupled to the word line, the word line driver circuit operable to adjust a read voltage for the word line during a read operation when the compare signal indicates a concurrent compare operation.

2. The CAM array of claim 1, wherein the word line driver circuit drives the word line with a relatively low read voltage when the compare signal is asserted and drives the word line with a relatively high read voltage when the compare signal is not asserted.

3. A content addressable memory (CAM) array having any number of rows, each of the rows comprising:
   a plurality of CAM cells coupled to a word line; and
   a word line driver circuit having a first input to receive a decoded address signal, a second input to receive a compare signal, and an output coupled to the word line, the word line driver circuit operable to adjust a read voltage for the word line for a read operation in response to the compare signal, wherein during a read operation the word line driver circuit drives the word line with a relatively low read voltage when there is a concurrent compare operation and drives the word line with a relatively high read voltage when there is not a concurrent compare operation.

4. The CAM array of claim 3, wherein the compare signal indicates the compare operation.

5. The CAM array of claim 2, wherein the relatively high read voltage comprises a supply voltage and the relatively low read voltage comprises approximately one transistor threshold voltage below the supply voltage.

6. The CAM array of claim 1, wherein the word line driver circuit comprises power terminals coupled to a supply voltage and to ground potential.

7. The CAM array of claim 6, wherein the word line driver circuit comprises:
   a first inverter having an input responsive to the decoded address signal, an output coupled to the word line, a first power terminal coupled to ground potential, and a second power terminal;
   an NMOS transistor coupled between a supply voltage and the second power terminal and having a gate responsive to the compare signal; and
   first and second PMOS transistors coupled in series between the supply voltage and the word line, the first PMOS transistor having a gate responsive to the compare signal and the second PMOS transistor having a gate responsive to the decoded address signal.

8. The CAM array of claim 7, wherein the inverter comprises a CMOS inverter.

9. The CAM array of claim 7, further comprising a second inverter having an output coupled to the first inverter and having an input to receive the decoded address signal.

10. The CAM array of claim 1, wherein the word line driver circuit comprises power terminals coupled to a high supply voltage, to a low supply voltage, and to ground potential.

11. The CAM array of claim 10, wherein the word line driver circuit comprises:
    a first driver having a power terminal coupled to the high voltage supply, an input to receive the decoded address signal, and an output;
    a second driver having a power terminal coupled to the low voltage supply, an input to receive the decoded address signal, and an output; and
    a multiplexer having inputs coupled to the outputs of the first and second drivers, an output coupled to the word line, and a control terminal to receive the compare signal.

12. The CAM array of claim 1, wherein the word line driver circuit comprises an address decoder.

13. The CAM array of claim 1, wherein the word line driver circuit comprises the CAM array.

14. A content addressable memory (CAM) array having any number of rows, each of the rows comprising:
    a plurality of CAM cells coupled to a word line;
    means for driving the word line during a read operation with a relatively low read voltage if there is a concurrent compare operation and for driving the word line during the read operation with a relatively high read voltage if there is not a concurrent compare operation.

15. The CAM array of claim 14, wherein a compare signal is asserted when there is a compare operation and is de-asserted when there is not a compare operation.

16. The CAM array of claim 15, wherein the means for driving comprises:
    a first inverter having an input responsive to a decoded address signal, an output coupled to the word line, a first power terminal coupled to ground potential, and a second power terminal;
    an NMOS transistor coupled between a supply voltage and the second power terminal and having a gate responsive to the compare signal; and
    first and second PMOS transistors coupled in series between the supply voltage and the word line, the first PMOS transistor having a gate responsive to the compare signal and the second PMOS transistor having a gate responsive to the decoded address signal.

17. The CAM array of claim 16, further comprising a second inverter having an output coupled to the first inverter and having an input to receive the decoded address signal.

18. The CAM array of claim 15, wherein the means for driving comprises:
    a first driver having a power terminal coupled to the high voltage supply, an input to receive the decoded address signal, and an output;
    a second driver having a power terminal coupled to the low voltage supply, an input to receive the decoded address signal, and an output; and
    a multiplexer having inputs coupled to the outputs of the first and second drivers, an output coupled to the word line, and a control terminal to receive the compare signal.

19. A method for controlling a word line of a content addressable memory (CAM) array, comprising:
    providing a compare signal to the array; and
    adjusting a read voltage for the word line during a read operation when the compare signal indicates there is a concurrent compare operation.

20. The method of claim 19, wherein the compare signal is asserted when there is a compare operation and de-asserted when there is not a compare operation.

21. The method of claim 19, wherein the adjusting comprises:
    providing a relatively low word line read voltage when there is a compare operation; and
    providing a relatively high word line read voltage when there is not a compare operation.

22. A method of selecting a word line of a content addressable memory (CAM) array for a read operation, comprising:
    driving the word line with a relatively low read voltage when there is a concurrent compare operation; and
    driving the word line with a relatively high read voltage when there is not a concurrent compare operation.

23. The method of claim 22, wherein the high read voltage comprises a supply voltage and the low read voltage comprises approximately one transistor threshold voltage below the supply voltage.

24. A method for controlling a word line of a content addressable memory (CAM) array during a read operation, comprising:
    enabling a first driver to drive the word line with a relatively low read voltage if there is a concurrent compare operation; and
    enabling a second driver to drive the word line with a relatively high read voltage if there is not a concurrent compare operation.

25. The method of claim 24, further comprising:
    disabling the first driver if there is not a concurrent compare operation; and
    disabling the second driver if there is a concurrent compare operation.

26. The method of claim 24, wherein the high read voltage comprises approximately a supply voltage and the low read voltage comprises approximately one transistor threshold voltage below the supply voltage.

* * * * *